(12) United States Patent
Sakurada et al.

(10) Patent No.: US 7,935,883 B2
(45) Date of Patent: May 3, 2011

(54) THERMOELECTRIC MATERIAL AND THERMOELECTRIC CONVERSION MODULE USING THE SAME

(75) Inventors: Shinya Sakurada, Shinagawa-ku (JP); Naoki Shutoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 577 days.

(21) Appl. No.: 11/896,540

(22) Filed: Sep. 4, 2007

(65) Prior Publication Data

US 2008/0236644 A1 Oct. 2, 2008

(30) Foreign Application Priority Data

Sep. 29, 2006 (JP) .................................. 2006-268340

(51) Int. Cl.
*H01L 35/14* (2006.01)
*H01L 35/20* (2006.01)
*H01L 35/00* (2006.01)
*H01L 37/00* (2006.01)
*C22C 38/06* (2006.01)
*C22C 38/12* (2006.01)
*C22C 38/14* (2006.01)
*C22C 27/02* (2006.01)

(52) U.S. Cl. .......... 136/239; 136/200; 136/240; 420/77; 420/78; 420/81; 420/127; 420/424

(58) Field of Classification Search .................. 136/239, 136/240, 200; 420/77, 78, 81, 127, 424
See application file for complete search history.

(56) References Cited

U.S. PATENT DOCUMENTS

2007/0034245 A1* 2/2007 Nakajima ..................... 136/205

FOREIGN PATENT DOCUMENTS

| JP | 2003197985 | * | 7/2003 |
| JP | 2004-119648 | | 4/2004 |
| JP | 2004-119948 | | 4/2004 |
| JP | 2004-253618 | | 9/2004 |
| JP | 2008-021982 | | 1/2008 |
| WO | 03/019681 | | 3/2003 |
| WO | WO 2005-104156 | * | 11/2005 |

OTHER PUBLICATIONS

Gotoh, M., et al. "Spin reorientation in the new Heusler alloys Ru2MnSb and Ru2MnGe," Physica B, 213&214, 306-308, 1995.*
Machine translation of JP2003-197985, pub. Jul. 2003.*

* cited by examiner

*Primary Examiner* — Jeffrey T Barton
*Assistant Examiner* — Allison Bourke
(74) *Attorney, Agent, or Firm* — Nixon & Vanderhye P.C.

(57) ABSTRACT

A thermoelectric material has a composition expressed by $(Fe_{1-p}V_p)_{100-x}(Al_{1-q}Si_q)_x$ ($0.35 \leq p \leq 0.7$, $0.01 \leq q \leq 0.7$, $20 \leq x \leq 30$ atomic %). The thermoelectric material includes a crystal phase having an $L2_1$ structure or a crystal phase having a B2 structure as a main phase.

17 Claims, 5 Drawing Sheets

… … …

THERMOELECTRIC MATERIAL AND THERMOELECTRIC CONVERSION MODULE USING THE SAME

CROSS-REFERENCE TO RELATED APPLICATION

This application is based upon and claims the benefit of priority from the prior Japanese Patent Application No. 2006-268340, filed on Sep. 29, 2006; the entire contents of which are incorporated herein by reference.

BACKGROUND OF THE INVENTION

1. Field of the Invention

The present invention relates to a thermoelectric material and a thermoelectric conversion module using the same.

2. Description of the Related Art

In recent years, with rising consciousness about the global environmental issues and the like, there has been growing interest in thermoelectric cooling devices using the Peltier effect, which are CFC-free refrigerators. Similarly, from the viewpoint of reduction in exhaust amount of carbon dioxide, and effective use of energy, there has been growing interest in thermoelectric power generating devices using the Seebeck effect, as a power generating system using unused waste heat energy. These thermoelectric conversion devices include a thermoelectric conversion module in which p-type and n-type thermoelectric materials are alternately connected in series.

As the thermoelectric material which is applied to the thermoelectric conversion module, a Bi—Te type single crystal and poly crystal are frequently used in the devices used at around a room temperature. When a thermoelectric conversion module is manufactured, both p-type and n-type materials are constituted of Bi—Te type materials. The n-type material is generally doped with Se. For a thermoelectric material used at a temperature higher than a room temperature, a Pb—Te type material is used because of high efficiency.

The Bi—Te type and Pb—Te type thermoelectric materials include Se (selenium), Pb (lead) and Te (tellurium) which are toxic and harmful to humans. These are also unfavorable substances from the viewpoint of the global environmental issues. Therefore, thermoelectric materials which are substituted for Bi—Te type and Pb—Te type materials are demanded, and the study on harmless thermoelectric materials is being carried out. As harmless thermoelectric materials, an Fe—V—Al type material having an $L2_1$ structure attracts attention (see JP-A 2004-119648 (KOKAI) and JP-A 2004-119948 (KOKAI)).

An $Fe_2VAl$ alloy which is the result of substituting V for ⅓ of Fe in $Fe_3Al$ has an $L2_1$ structure (a so-called Heusler structure), and shows the behavior of electric conduction of a semiconductor. The $Fe_2VAl$ alloy attracts attention as the material showing a high Seebeck coefficient, which is equivalent to that of an Bi—Te material, at a room temperature. Further, by substituting Si for a part of Al in the $Fe_2VAl$ alloy, the power factor ($=\alpha^2/\rho$, where $\alpha$ is a Seebeck coefficient of the thermoelectric material, and $\rho$ is an electric resistivity of the thermoelectric material) of the thermoelectric material is enhanced.

However, the thermal conductivity of the Fe—V—Al type material is higher than that of the Bi—Te type material by about one order of magnitude, and this becomes the barrier to commercialization. The practical characteristics of the thermoelectric material are expressed by the figure of merit Z ($=\alpha^2/(\rho\cdot\kappa)$, where $\kappa$ is a thermal conductivity of the thermoelectric material). Therefore, even if the power factor based on the Seebeck coefficient $\alpha$ and the electric resistivity $\rho$ is high, when the value of the thermal conductivity $\kappa$ of the thermoelectric material is high, the value of the figure of merit Z indicating practicality of the thermoelectric material cannot be increased sufficiently.

SUMMARY OF THE INVENTION

A thermoelectric material according to an aspect of the present invention has a composition expressed by a composition formula:

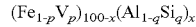

(where, p is a value satisfying $0.35 \leq p \leq 0.7$, q is a value satisfying $0.01 \leq p \leq 0.7$, and x is a value satisfying $20 \leq x \leq 30$ atomic %).

A thermoelectric conversion module according to an aspect of the present invention includes a first electrode, a p-type thermoelectric element with one end connected to the first electrode, a second electrode connected to the other end of the p-type thermoelectric element, an n-type thermoelectric element with one end connected to the second electrode, and a third electrode connected to the other end of the n-type thermoelectric element, wherein at least one of the p-type thermoelectric element and the n-type thermoelectric element is composed of the thermoelectric material according to the aspect of the present invention.

DETAILED DESCRIPTION OF THE INVENTION

Figure 1:
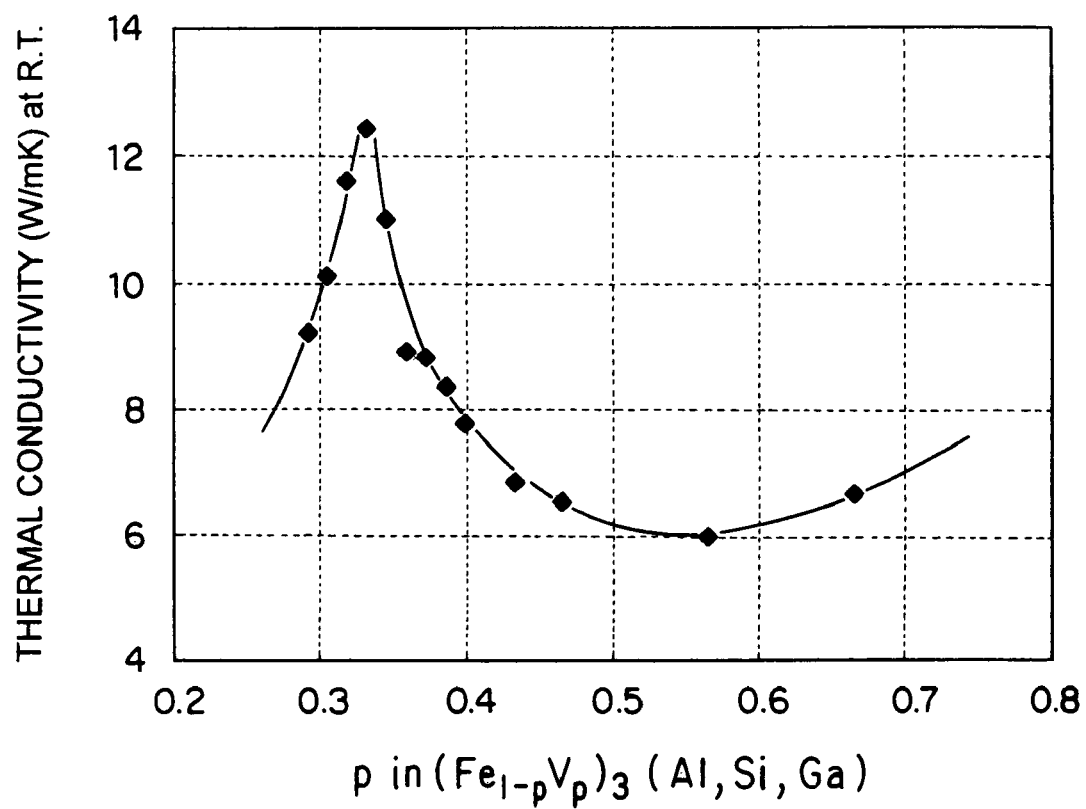
FIG. 1 is diagram showing a change in a thermal conductivity when a composition ratio of V of an Fe—V—(Al, Si) material is changed.

Hereinafter, a mode for carrying out the present invention will be described. A thermoelectric material according to an embodiment of the present invention has a composition expressed by a composition formula:

 (1)

(where p, q and x are values satisfying $0.35 \leq p \leq 0.7$, $0.01 \leq q \leq 0.7$, and $20 \leq x \leq 30$ atomic %). The thermoelectric material includes a crystal phase having, for example, an $L2_1$ structure ($L2_1$ crystal phase) as a main phase.

A figure of merit Z of the thermoelectric material is expressed by $$Z = \alpha^2/(\rho\cdot\kappa) \quad (2)$$

(where, $\alpha$ represents a Seebeck coefficient of the thermoelectric material, $\rho$ represents an electric resistivity of the thermoelectric material and $\kappa$ represents a thermal conductivity of the thermoelectric material).

The figure of merit Z expressed by the formula (2) has the dimension of the inverse number of the temperature, and when the figure of merit Z is multiplied by the absolute temperature T, a dimensionless value is obtained. The material with a larger figure of merit Z has higher thermoelectric conversion efficiency. As is understood from the formula (2), in order to realize the thermoelectric material having a larger figure of merit Z, the thermoelectric material having a higher Seebeck coefficient α, a lower electric resistivity ρ and a lower thermal conductivity κ is demanded.

In an Fe—V—Al type material having an $L2_1$ crystal phase (Heusler phase) or the like as a main phase, by setting the composition ratio of Fe and V in the region of a higher concentration of V than in the conventional Heusler composition ($Fe_2VAl$), and by substituting Si for a part of Al, the thermal conductivity can be reduced without reducing the Seebeck coefficient of the thermoelectric material. Thereby, the Fe—V—(Al, Si) type thermoelectric material having the practical thermoelectric characteristics enhanced can be provided.

A thermoelectric material of this embodiment will be described in detail. The $L2_1$ crystal phase is a phase carrying the thermoelectric characteristics. The $L2_1$ structure is a crystal structure with high regularity, and contributes to enhancement of the thermoelectric characteristics of the thermoelectric material. The thermoelectric material preferably has the $L2_1$ crystal phase as the main phase. A crystal phase (B2 crystal phase) having a B2 structure having a similar crystal structure to the $L2_1$ structure and having the regularity of atoms reduced a little is also known for its showing the thermoelectric characteristics, though the characteristics are inferior to those of the $L2_1$ crystal phase. Depending on the use purpose and prescribed characteristics, the main phase of the thermoelectric material may be the B2 crystal phase.

The main phase of the thermoelectric material means a phase having the largest volume occupancy ratio with respect to the total amount of all the crystal phases and non-crystal phases constituting the thermoelectric material. The ratio of the main phase is preferably 50 volume % or more, more preferably 70 volume % or more, and desirably 90 volume % or more. The main phase of the thermoelectric material is the $L2_1$ crystal phase or the B2 crystal phase.

On realizing the Fe—V—(Al, Si) type thermoelectric material having the $L2_1$ crystal phase or the like as the main phase, the value of x in the formula (1) is set in the range of 20 to 30 atomic %. If the total amount of (Al, Si) expressed by x deviates from the above described range, the precipitation amount of the phases other than the $L2_1$ crystal phase or the B2 crystal phase becomes large. Thereby, the thermoelectric characteristics, especially, the Seebeck coefficient α reduces. The value of x is more preferably set in the range of 23 to 27 atomic %.

In the Fe—V—(Al, Si) type thermoelectric material of this embodiment, the V-rich composition is applied as compared with the conventional Heusler composition (equivalent to $Fe_2V(Al, Si)$, p=⅓). In the composition formula of the formula (1), the value of p indicating the composition ratio of Fe—V is set in the range from 0.3 to 0.7 inclusive. When the composition richer in V (0.35≦p) than the composition ratio of Fe—V in the conventional Heusler composition (P=⅓) is adopted, the thermal conductivity of the thermoelectric transducing material can be reduced while the Heusler phase as the main phase is maintained.

FIG. 1 shows a change in the thermal conductivity κ when the value of p indicating the composition ratio of V is changed in the thermoelectric material of the composition of $[(Fe_{1-p}V_p)_{75}(Al_{0.6}Si_{0.1}Ga_{0.3})_{25}]$. As obvious from FIG. 1, by increasing the value of p indicating the composition ratio of V from the conventional Heusler composition (0.35 or more), the thermal conductivity κ of the thermoelectric transducing material reduces, and shows the minimum value in the vicinity of p=0.5. When the value of p is made too large (0.7<p), the thermal conductivity κ increases on the other hand.

By applying the Fe—V composition in which the value of p is in the range of 0.35 to 0.7, the thermoelectric material with the thermal conductivity κ reduced can be obtained. By further reducing the thermal conductivity κ of the thermoelectric material, the figure of merit Z indicating the practical characteristics of the thermoelectric material can be enhanced. Therefore, according to the thermoelectric material having the Fe—V composition with the value of p in the range of 0.35 to 0.7, an excellent figure of merit Z can be obtained.

The value of p indicating the composition ratio of V is preferably set at 0.4 or more with which reduction in the thermal conductivity K of the thermoelectric material becomes remarkable. However, V is high in cost as compared with Fe, and as the composition ratio of V is increased, the manufacture cost rises. Therefore, from the viewpoint of realization of the high-performance thermoelectric material at low cost, the value of p is preferably set at 0.6 or less. The number of electrons of the 3d band reduces as a result of the composition ratio of Fe reducing, and this is likely to cause reduction in the Seebeck coefficient α. In this respect, the value of p is also more preferably set at 0.6 or less. The value of p can be from 0.5 to 0.6.

In the thermoelectric material of this embodiment, Si is further substituted for a part of Al. By substituting Si for a part of Al, the electric resistivity ρ of the thermoelectric material reduces. Thereby, the figure of merit Z of the thermoelectric material is also increased. Further, when the V-rich Fe—V composition is applied, the composition ratio of Fe reduces, and thereby, the number of electrons of the 3d band reduces. This is likely to cause reduction in the Seebeck coefficient α. With respect to this, by substituting Si for a part of Al and supplementing the trivalent electron amount, reduction in the Seebeck coefficient α can be suppressed.

The value of q indicating the substitution amount of Si for Al is set in the range from 0.01 to 0.7 inclusive. If the substitution amount q of Si is less than 0.01, the effect of reducing the electric resistivity ρ of the thermoelectric material and the effect of supplementing the trivalent electron amount cannot be obtained sufficiently. When the substitution amount q of Si exceeds 0.7, the thermal conductivity κ of the thermoelectric material increases, and as a result, the figure of merit Z reduces. The substitution amount q of Si for Al is more preferably set in the range of 0.05 to 0.5.

By applying the V-rich Fe—V composition (p=0.35 to 0.7), and by substituting Si for a part of Al (in the range from 1 atomic % to 70 atomic % inclusive), the thermal conductivity κ of the Fe—V—(Al, Si) material can be reduced while reduction in the Seebeck coefficient α or the like is suppressed. Further, by substituting Si for a part of Al, the electric resistivity ρ can be reduced. As a result, the Fe—V—(Al, Si) type thermoelectric material with the thermoelectric characteristics expressed by the figure of merit Z enhanced can be provided.

In the thermoelectric material having the composition expressed by the formula (1), a part of V may be replaced by at least one of element M selected from Ti, Zr, Hf, Nb, Ta, Cr, Mo and W. By substituting the element M, the carrier concentration is optimized and the electric resistivity can be reduced. As the element M, at least one of element selected from Ti, Zr, Nb, Cr, Mo and W is effective. If the substitution amount is too large, reduction in the Seebeck coefficient or the like is likely to be caused, and therefore, the substitution amount of the element M is preferably set at 20 atomic % or less of V.

A part of Fe may be replaced by at least one of element T selected from Mn, Co, Ni, Cu and Ag. By substituting the element T, the thermal conductivity and the electric resistivity can be reduced. As the element T, at least one of element selected from Mn, Co and Ni is effective. If the substitution amount is too large, reduction in the Seebeck coefficient or the like is likely to be caused, and therefore, the substitution amount of the element T is preferably set at 20 atomic % or less of Fe.

A part of Al and Si may be replaced by at least one of element x selected from Ga, In, Tl, Ge, Sn, Sb and Bi. By substituting the element X, the thermal conductivity can be reduced. As the element X, Ga and Sn effective for reduction of the thermal conductivity is preferably used. If the substitution amount is too large, reduction in the Seebeck coefficient is likely to be caused, and therefore, the substitution amount of the element X is preferably set at 20 atomic % or less of the total amount of Al and Si.

The thermoelectric material of this embodiment is produced as follows. First, an alloy containing a predetermined amount of each element is produced by an arc melting method and a high frequency melting method. For producing the alloy, a rapidly quenching method such as a single roll method, a twin roll method, a rotary disk method and a gas atomizing method, and a solid phase reaction method such as a mechanical alloying method may be adopted. The rapidly quenching method and the mechanical alloying method are advantageous in the respects of miniaturization of the crystal phases constituting the alloy, enlargement of the solution region of the elements into the crystal phases and the like. By them, the thermal conductivity of the thermoelectric material can be reduced and the Seebeck coefficient can be increased.

Heat treatment is applied to the produced alloy in accordance with necessity. By applying the heat treatment, the alloy can be made to have a single phase, and the crystal grain size can be controlled. By them, the thermoelectric characteristics can be more enhanced. Each of the processes of melting, rapidly quenching, mechanical alloying, heat treatment and the like is preferably performed in an inert atmosphere such as Ar, from the viewpoint of prevention of oxidation of the alloy.

Next, the alloy is crushed by a ball mill, a brown mill, a stamp mill or the like, and alloy powder is produced. The alloy powder is integrated (molded) by applying a sintering method, a hot pressing method, a spark plasma sintering method or the like. From the viewpoint of prevention of oxidation of the alloy, the molding process is preferably carried out in an inert atmosphere such as Ar. Thereafter, the molded body is machined into a desired size, and thereby, the thermoelectric material of the embodiment can be obtained.

The shape and size of the molded body can be properly selected. For example, the shape of the thermoelectric material can be formed into, a circular cylindrical body of an outer diameter of 0.5 to 10 mm by a thickness of 1 to 30 mm, a rectangular parallelepiped of 0.5 to 10 mm by 0.5 to 10 mm by a thickness of 1 to 30 mm.

Next, an embodiment of a thermoelectric conversion module of the present invention will be described. A thermoelectric conversion module 10 shown in FIG. 2 has a p-type thermoelectric element 11 constituted of a p-type thermoelectric material which is a p-type semiconductor, and an n-type thermoelectric element 12 constituted of an n-type thermoelectric material which is an n-type semiconductor. The thermoelectric material of the embodiment is applied to at least one of the p-type and n-type thermoelectric elements 11 and 12.

The thermoelectric material having the composition expressed by the formula (1) is especially preferable for the n-type thermoelectric element 12. However, by controlling the composition of a dopant or the like, it can be applied to the p-type thermoelectric element 11. When the thermoelectric material of this embodiment is applied to only one of the p-type and n-type thermoelectric elements 11 and 12 (for example, the n-type thermoelectric element 12), the other one (for example, the p-type thermoelectric element 11) may be constituted of a Bi—Te thermoelectric material or the like.

The p-type and n-type thermoelectric elements 11 and 12 are disposed in parallel. An upper end portion of the p-type thermoelectric element 11 is electrically and mechanically connected to a first electrode 13A. An upper end portion of the n-type thermoelectric element 12 is electrically and mechanically connected to a third electrode 13B. An upper insulating substrate 14 is disposed on the outer sides of the first and the third electrodes 13A and 13B. Lower end portions of the p-type and n-type thermoelectric materials 11 and 12 are electrically and mechanically connected to a second electrode 15, respectively. The second electrode 15 is supported by a lower insulating substrate 16.

As above, the p-type and n-type thermoelectric elements 11 and 12 are connected in series with the first, the second and the third electrodes 13A, 15 and 13B. The electrodes 13A, 15 and 13B are preferably constituted of a metal material having at least one selected from, for example, Cu, Ag and Fe as a main constituent. For the insulating substrates 14 and 16, insulating ceramics substrates are applied. For the insulating substrates 14 and 16, ceramics substrates constituted of a sintered material having at least one selected from aluminum nitride, silicon nitride, alumina and magnesia as a main constituent are preferably used.

By giving a temperature difference to between the upper and lower insulating substrates 14 and 16 of the thermoelectric conversion module 10, for example, the upper insulating substrate 14 is made the low temperature side, and the lower insulating substrate 16 is made the high temperature side. When such a temperature difference is given, a hall 17 having a positive electric charge moves to the lower temperature side inside the p-type thermoelectric element 11, and an electron 18 having a negative electric charge moves to the lower temperature side inside the n-type thermoelectric element 12. As a result, a potential difference occurs between the first electrode 13A and the third electrode 13B.

When a voltage is applied with the first electrode 13A as a positive electrode and the third electrode 13B as a negative electrode in such a thermoelectric conversion module 10, the holes and electrons move as described above, and a temperature difference occurs to both ends of the individual thermoelectric elements 11 and 12. Heat absorption occurs at the upper insulating substrate 14 at the low temperature side, and heat release occurs at the lower insulating substrate 16 at the high temperature side. Accordingly, by disposing a processing target on the upper insulating substrate 14 where heat absorption occurs, the processing target can be cooled by being deprived of heat. Heat absorption can be used as the cooling device for the processing target.

When a processing target is disposed on the lower insulating substrate 16 where heat release occurs, the processing target can be heated. Heat release of the thermoelectric conversion module 10 can be used as the heating device for the processing target. The thermoelectric conversion module 10 is not limited for the purpose of cooling or heating in which electricity is converted into heat, but can be applied for the purpose of power generation in which heat is converted into electric power.

Figure 2:
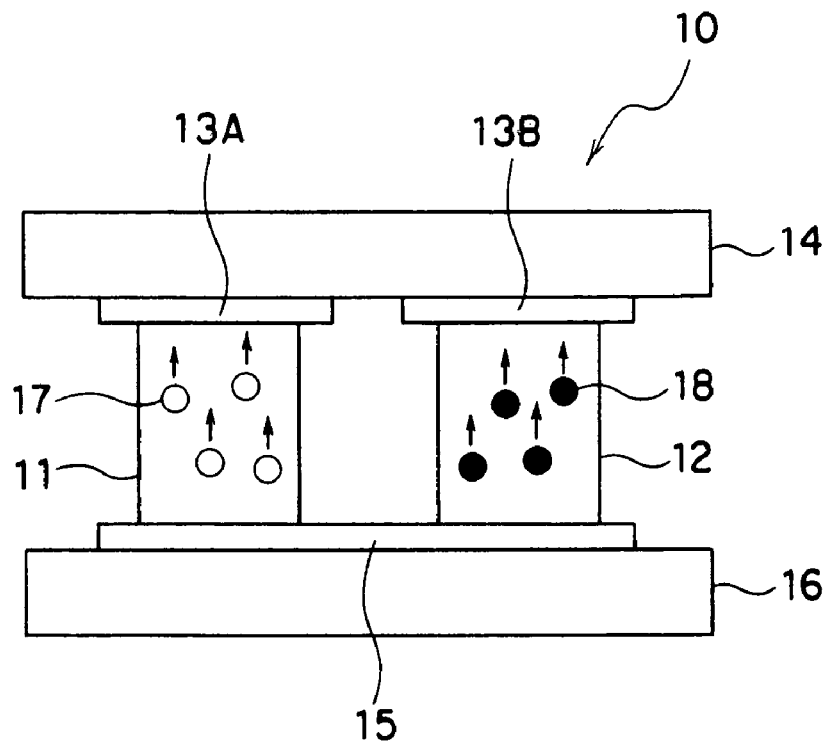
FIG. 2 is a view showing a basic structure of a thermoelectric conversion module according to an embodiment.
Figure 3:
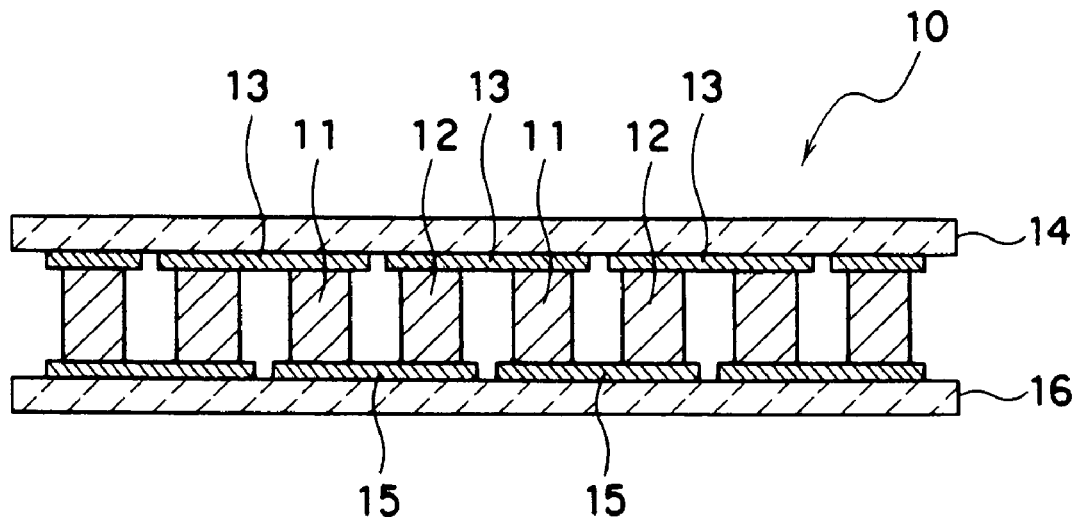
FIG. 3 is a sectional view showing the constitution of the thermoelectric conversion module according to the embodiment.

A practical structure of the thermoelectric conversion module 10 is shown in FIG. 3. In the thermoelectric conversion module 10 shown in FIG. 3, a plurality of p-type thermoelectric elements 11, 11 . . . , and a plurality of n-type thermoelectric elements 12, 12 . . . are disposed between the upper insulating substrate 14 and the lower insulating substrate 16. They are alternately disposed. By connecting a plurality of p-type thermoelectric elements 11, 11 . . . and a plurality of n-type thermoelectric elements 12, 12 . . . in series with the first and the third electrodes 13 and the second electrodes 15, a larger cooling effect or heating effect than with the structure shown in FIG. 2 can be obtained.

By using the thermoelectric conversion module 10 shown in FIG. 3 as a thermoelectric cooling device and a thermoelectric heating device, a larger cooling effect and heating effect can be obtained. The thermoelectric conversion module 10 shown in FIG. 3 can be said to be of a practical module structure. In FIG. 3, the first and the third electrodes are collectively designated by the reference numeral 13.

Next, concrete examples of the present invention and the evaluation results of them will be described.

EXAMPLE 1

Figure 4:
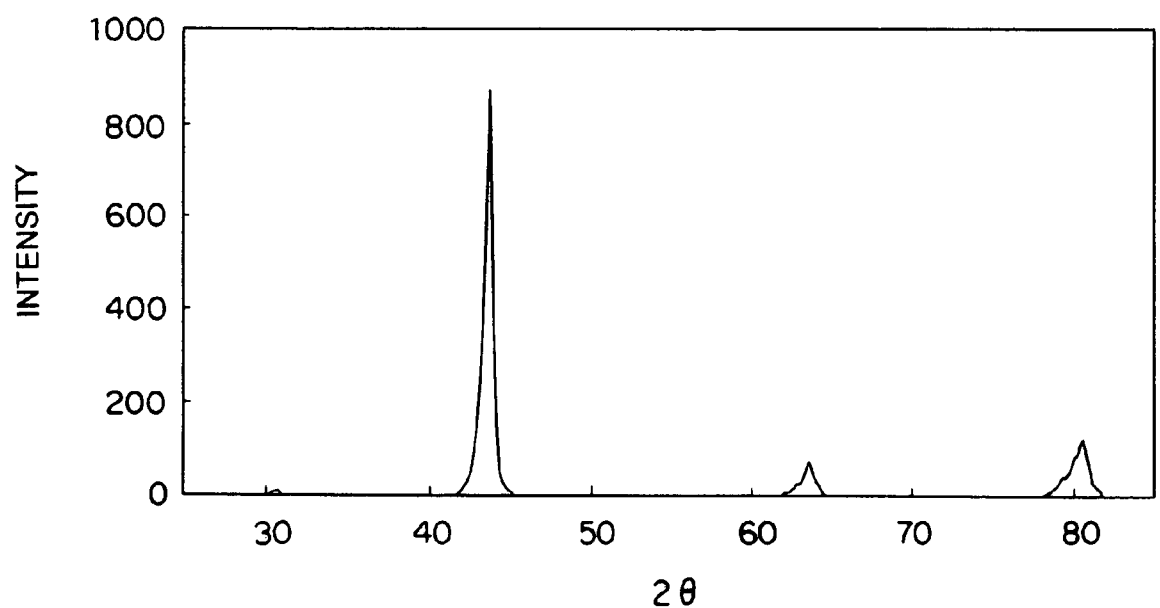
FIG. 4 is a diagram showing X-ray diffraction result of a thermoelectric material according to an example.

A predetermined amount of each of the raw materials of Fe, V, Al and Si was weighed to achieve the composition of $(Fe_{0.5}V_{0.5})_{75}(Al_{0.9}Si_{0.1})_{25}$, and this was subjected to arc melting and the mother alloy was produced. The mother alloy was pulverized into a particle size of 45 µm or less with the mortar. Next, the alloy powder was sintered by spark plasma sintering method under the conditions of 950° C.×1 hour, and the molded body of an outer diameter of 10 mm and a thickness of 2 mm (thermoelectric material) was produced. The chip in a desired shape was cut out from the molded body and was provided for evaluation of the thermoelectric characteristics. As a result of providing the remaining part to the powder X-ray diffraction and examining the generated phase, the diffraction peak mainly derived from the $L2_1$ crystal phase (Heusler phase) was observed. The X-ray diffraction result is shown in FIG. 4.

EXAMPLES 2 TO 14

Figure 5:
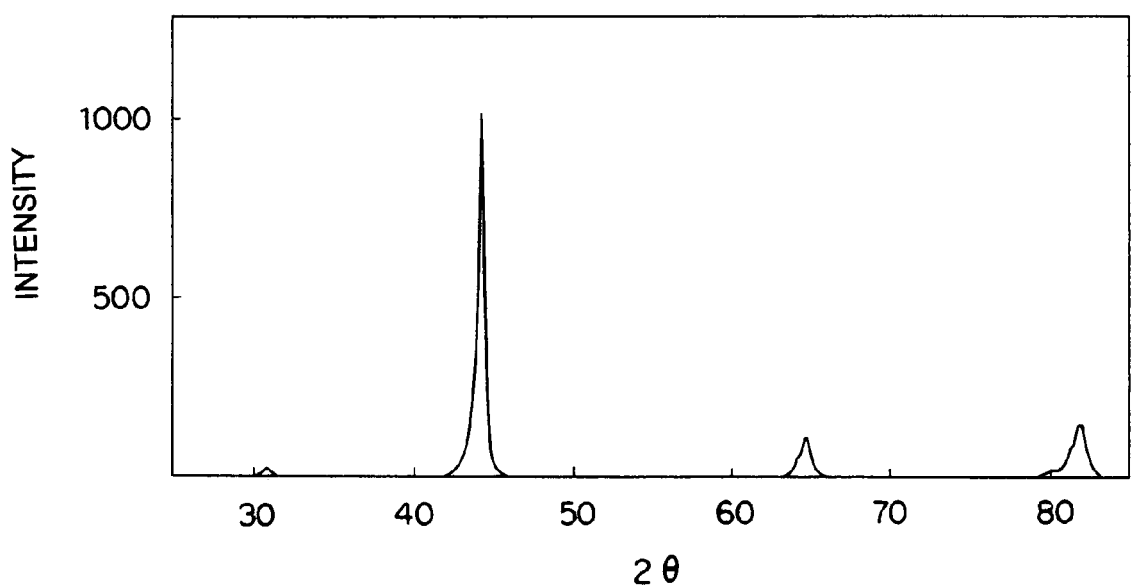
FIG. 5 is a diagram showing X-ray diffraction result of a thermoelectric material according to other example.

Predetermined amounts of the respective materials were weighed to achieve the compositions shown in Table 1, respectively, and they were subjected to arc melting and the mother alloys were produced. Each of these mother alloys was pulverized into a particle size of 45 µm or less with the mortar. Next, each alloy powder was sintered by spark plasma sintering method under the conditions of 950° C.×1 hour, and each of molded bodies of an outer diameter of 10 mm and a thickness of 2 mm (thermoelectric material) was produced. The chip in a desired shape was cut out from each of the molded bodies and was provided for evaluation of the thermoelectric characteristics. As a result of providing each remaining part to the powder X-ray diffraction and examining the generated phase, the diffraction peak mainly derived from the $L2_1$ crystal phase was observed in each of them. The X-ray diffraction result of the thermoelectric material of the $(Fe_{0.65}V_{0.35})_{75}(Al_{0.6}Ga_{0.3}Si_{0.1})_{25}$ is shown in FIG. 5.

COMPARATIVE EXAMPLE 1

The thermoelectric material was produced similarly to the example 1 except that the composition of $Fe_2VAl$ $((Fe_{0.67}V_{0.33})_{75}Al_{25})$ was applied. The chip in a desired shape was cut out from the molded body and was provided for evaluation of the thermoelectric characteristics. As a result of providing the remaining part to the powder X-ray diffraction and examining the generated phase, the diffraction peak mainly derived from the $L2_1$ crystal phase was observed.

COMPARATIVE EXAMPLE 2

Figure 6:
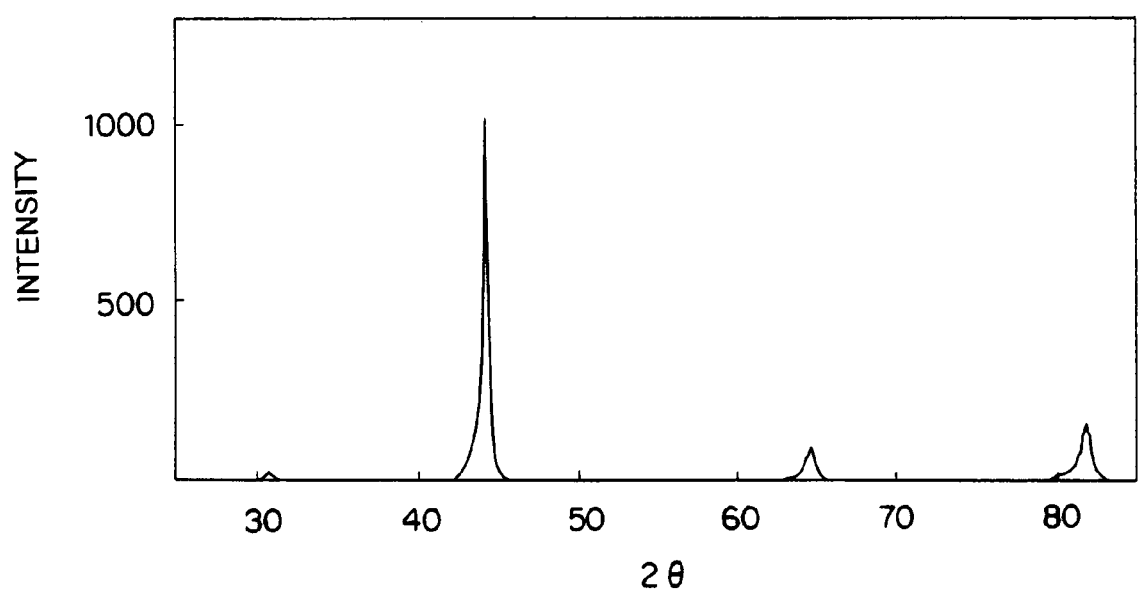
FIG. 6 is a diagram showing X-ray diffraction result of a thermoelectric material according to a comparative example.

The composition $((Fe_{0.67}V_{0.33})_{75}(Al_{0.9}Si_{0.1})_{25})$ which was the result of substituting Si for 10 atomic % of Al of the alloy composition according to the comparative example 1 was applied, and the thermoelectric material was produced similarly to the comparative example 1 except for the composition. The chip in a desired shape was cut out from the molded body and was provided for evaluation of the thermoelectric characteristics. As a result of providing the remaining part to the powder X-ray diffraction and examining the generated phase, the diffraction peak mainly derived from the $L2_1$ crystal phase was observed. The X-ray diffraction result is shown in FIG. 6.

COMPARATIVE EXAMPLE 3

The thermoelectric material was produced similarly to the example 1, except that the composition $((Fe_{0.2}V_{0.8})_{75}(Al_{0.9}Si_{0.1})_{25})$ which was the result of further enhancing the V ratio in the Fe—V composition in the alloy composition according to the comparative example 1 was applied. The chip in a desired shape was cut out from the molded body and was provided for evaluation of the thermoelectric characteristics.

COMPARATIVE EXAMPLE 4

The thermoelectric material was produced similarly to the example 1, except that the composition $((Fe_{0.5}V_{0.5})_{75}Al_{25})$ without substitution of Si for Al in the alloy composition according to the example 1 was applied. The chip in a desired shape was cut out from the molded body and was provided for evaluation of the thermoelectric characteristics. As a result of providing the remaining part for the powder X-ray diffraction and examining the generated phase, the diffraction peak mainly derived from the $L2_1$ crystal phase was observed.

COMPARATIVE EXAMPLE 5

The thermoelectric material was produced similarly to the example 1, except that the composition $((Fe_{0.5}V_{0.5})_{75}(Al_{0.2}Si_{0.8})_{25})$ which was the result of further enhancing the Si ratio in the Al—Si composition in the alloy composition according to the example 1 was applied. The chip in a desired shape was cut out from the molded body and was provided for evaluation of the thermoelectric characteristics. As a result of providing the remaining part for the powder X-ray diffraction and examining the generated phase, the diffraction peak mainly derived from the $L2_1$ crystal phase was observed.

The characteristics of the thermoelectric materials of the above described examples 1 to 14 and the comparative examples 1 to 5 were measured and evaluated as follows. The thermal diffusivity of each of the thermoelectric materials was measured by a laser flash method, the density was measured by an Archimedean method, the specific heat was measured by a DSC (differential scanning calorimetry) method, respectively. The thermal conductivity κ was obtained from these results. The electric resistivity ρ of each of the thermoelectric materials was measured by a four probes method.

Each of the thermoelectric materials was cut into a needle shape, and the Seebeck coefficient α was measured. These values are shown in Table 2 altogether.

TABLE 1

| | Composition (atomic %) |
|---|---|
| Example 1 | $(Fe_{0.5}V_{0.5})_{75}(Al_{0.9}Si_{0.1})_{25}$ |
| Example 2 | $(Fe_{0.55}V_{0.45})_{75}(Al_{0.7}Si_{0.3})_{25}$ |
| Example 3 | $(Fe_{0.5}V_{0.5})_{72}(Al_{0.9}Si_{0.1})_{28}$ |
| Example 4 | $(Fe_{0.5}V_{0.5})_{78}(Al_{0.9}Si_{0.1})_{22}$ |
| Example 5 | $(Fe_{0.5}V_{0.4}Ti_{0.1})_{75}(Al_{0.9}Si_{0.1})_{25}$ |
| Example 6 | $(Fe_{0.4}Mn_{0.1}V_{0.5})_{75}(Al_{0.9}Si_{0.1})_{25}$ |
| Example 7 | $(Fe_{0.55}V_{0.45})_{75}(Al_{0.5}Si_{0.3}Ga_{0.2})_{25}$ |
| Example 8 | $(Fe_{0.5}V_{0.4}Ta_{0.1})_{75}(Al_{0.5}Si_{0.3}Ga_{0.2})_{25}$ |
| Example 9 | $(Fe_{0.5}V_{0.5})_{75}(Al_{0.8}Si_{0.1}Sn_{0.1})_{25}$ |
| Example 10 | $(Fe_{0.5}V_{0.4}Ta_{0.1})_{75}(Al_{0.4}Si_{0.3}Ga_{0.2}Sn_{0.1})_{25}$ |
| Example 11 | $(Fe_{0.5}V_{0.5})_{75}(Al_{0.99}Si_{0.01})_{25}$ |
| Example 12 | $(Fe_{0.5}V_{0.5})_{75}(Al_{0.95}Si_{0.05})_{25}$ |
| Example 13 | $(Fe_{0.5}V_{0.5})_{75}(Al_{0.3}Si_{0.7})_{25}$ |
| Example 14 | $(Fe_{0.5}V_{0.5})_{75}(Al_{0.5}Si_{0.5})_{25}$ |
| Comparative Example 1 | $(Fe_{0.67}V_{0.33})_{75}Al_{25}$ |
| Comparative Example 2 | $(Fe_{0.67}V_{0.33})_{75}(Al_{0.9}Si_{0.1})_{25}$ |
| Comparative Example 3 | $(Fe_{0.2}V_{0.8})_{75}(Al_{0.9}Si_{0.1})_{25}$ |
| Comparative Example 4 | $(Fe_{0.5}V_{0.5})_{75}Al_{25}$ |
| Comparative Example 5 | $(Fe_{0.5}V_{0.5})_{75}(Al_{0.2}Si_{0.8})_{25}$ |

TABLE 2

| | Thermal conductivity κ (W/m·K) | Thermal conductivity α (μV/K) | Electric resistivity ρ (mΩ·cm) |
|---|---|---|---|
| Example 1 | 8.5 | −125 | 0.4 |
| Example 2 | 7.2 | −150 | 0.6 |
| Example 3 | 8.2 | −155 | 0.5 |
| Example 4 | 7.5 | −165 | 0.6 |
| Example 5 | 7.8 | −153 | 0.4 |
| Example 6 | 7.0 | −140 | 0.5 |
| Example 7 | 5.2 | −140 | 0.4 |
| Example 8 | 4.8 | −145 | 0.5 |
| Example 9 | 6.9 | −150 | 0.7 |
| Example 10 | 5.1 | −157 | 0.4 |
| Example 11 | 8.7 | −122 | 0.5 |
| Example 12 | 8.6 | −125 | 0.5 |
| Example 13 | 7.5 | −133 | 0.6 |
| Example 14 | 6.8 | −128 | 0.5 |
| Comparative Example 1 | 18.5 | −175 | 1.8 |
| Comparative Example 2 | 13.5 | −125 | 0.4 |
| Comparative Example 3 | 11.8 | −25 | 0.4 |
| Comparative Example 4 | 14.2 | −50 | 0.5 |
| Comparative Example 5 | 16.7 | −65 | 0.5 |

As is obvious from Table 2, it is found out that each of the thermoelectric materials of the examples 1 to 14 has low thermal conductivity κ as compared with the comparative example 1 and the comparative example 2 to which the conventional Heusler compositions were applied, and can obtain excellent thermoelectric characteristics as a result. As shown in the comparative example 3, sufficient thermoelectric characteristics cannot be obtained when the V ratio in the Fe—V composition is made too high because the thermal conductivity κ rises. Further, it is found out that when the composition in which Si is not substituted for Al as shown in the comparative example 4, and the composition in which Si is substituted for an excessive amount of Al as shown in the comparative example 5, sufficient thermoelectric characteristics cannot be obtained.

Next, by using each of the thermoelectric materials of the above described examples 1 to 14 was used as the n-type thermoelectric material, the thermoelectric conversion module of which structure is shown in FIG. 2 was produced. When the DC current is passed to these thermoelectric conversion modules, and the cooling characteristics at the low temperature sides were evaluated, the thermoelectric conversion modules using the thermoelectric materials of the respective examples all showed favorable results.

The present invention is not limited to the above described embodiments, and may be variously modified in the range departing from the spirit of the invention in the stage of being carried out. Further, each of the embodiments can be carried out by being properly combined as much as possible, and in this case, the combined effect can be obtained. Further, the above described embodiments include the invention at the various stages, and various inventions can be extracted by proper combination in a plurality of disclosed features.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thermoelectric material comprising a composition expressed by a composition formula:

$$(Fe_{1-p}V_p)_{100-x}(Al_{1-q}Si_q)_x$$

where, p is a value satisfying $0.5 \leq p \leq 0.6$,
q is a value satisfying $0.01 \leq q \leq 0.7$, and
x is a value satisfying $23 \leq x \leq 27$ atomic %, and wherein the thermoelectric material includes a crystal phase having an $L2_1$ structure as a main phase.

2. The material according to claim 1, wherein the value q satisfies $0.05 \leq q \leq 0.5$.

3. The material according to claim 1, wherein a part of the V (vanadium) is replaced by at least one element selected from Ti (titanium), Zr (zirconium), Hf (hafnium), Nb (niobium), Ta (tantalum), Cr (chromium), Mo (molybdenum) and W (tungsten).

4. The material according to claim 1, wherein a part of the Fe (iron) is replaced by at least one element selected from Mn (manganese), Co (cobalt), Ni (nickel), Cu (copper) and Ag (silver).

5. The material according to claim 1, wherein a part of a total amount of the Al (aluminum) and Si (silicon) is replaced by at least one element selected from Ga (gallium), In (indium), Tl (thallium), Ge (germanium), Sn (tin), Sb (antimony) and Bi (bismuth).

6. The material according to claim 5, wherein the part of the total amount of the Al (aluminum) and Si (silicon) is replaced by at least one element selected from Ga (gallium) and Sn (tin).

7. The material according to claim 6, wherein an amount replaced by at least one element selected from the Ga (gallium) and the Sn (tin) is 10 atomic % or more and 30 atomic % or less of the total amount of the Al (aluminum) and Si (Silicon).

8. The material according to claim 7, wherein the thermoelectric material has a thermal conductivity of 6.9 W/m·K or less.

9. A thermoelectric conversion module, comprising:
a first electrode;
a p-type thermoelectric element with one end connected to the first electrode;
a second electrode connected to the other end of the p-type thermoelectric element;
an n-type thermoelectric element with one end connected to the second electrode; and a third electrode connected to the other end of the n-type thermoelectric element, wherein at least one of the p-type thermoelectric element and the n-type thermoelectric element is composed of a thermoelectric material comprising a composition expressed by a composition formula:

$$(Fe_{1-p}V_p)_{100-x}(Al_{1-q}Si_q)_x$$

where, p is a value satisfying $0.5 \leq p \leq 0.6$, q is a value satisfying $0.01 \leq q \leq 0.7$, and x is a value satisfying $23 \leq x \leq 27$ atomic %, and wherein the thermoelectric material includes a crystal phase having an $L2_1$ structure as a main phase.

10. The module according to claim 9, wherein the value q satisfies $0.05 \leq q \leq 0.5$.

11. The module according to claim 9, wherein a part of the V (vanadium) is replaced by at least one element selected from Ti (titanium), Zr (zirconium), Hf (hafnium), Nb (niobium), Ta (tantalum), Cr (chromium), Mo (molybdenum) and W (tungsten).

12. The module according to claim 9, wherein a part of the Fe (iron) is replaced by at least one element selected from Mn (manganese), Co (cobalt), Ni (nickel), Cu (copper) and Ag (silver).

13. The module according to claim 9, wherein a part of a total amount of the Al (aluminum) and Si (silicon) is replaced by at least one element selected from Ga (gallium), In (indium), Tl (thallium), Ge (germanium), Sn (tin), Sb (antimony) and Bi (bismuth).

14. The module according to claim 9, wherein the p-type thermoelectric element comprises a plurality of p-type thermoelectric elements and the n-type thermoelectric element comprises a plurality of n-type thermoelectric elements, and the plurality of p-type thermoelectric elements and the plurality of n-type thermoelectric elements are alternately disposed and connected in series with the first, second and third electrodes.

15. The module according to claim 13, wherein the part of the total amount of the Al (aluminum) and Si (silicon) is replaced by at least one element selected from Ga (gallium) and Sn (tin).

16. The module according to claim 15, wherein an amount replaced by at least one element selected from the Ga (gallium) and the Sn (tin) is 10 atomic % or more and 30 atomic % or less of the total amount of the Al (aluminum) and Si (silicon).

17. The module according to claim 16, wherein the thermoelectric material has a thermal conductivity of 6.9 W/m·K or less.

* * * * *